United States Patent
Kretzer et al.

(10) Patent No.: US 8,329,295 B2
(45) Date of Patent: Dec. 11, 2012

(54) PROCESS FOR PRODUCING DOPED GALLIUM ARSENIDE SUBSTRATE WAFERS HAVING LOW OPTICAL ABSORPTION COEFFICIENT

(75) Inventors: Ulrich Kretzer, Chemnitz (DE); Frank Börner, Dresden (DE); Stefan Eichler, Dresden (DE); Frieder Kropfgans, Freiberg (DE)

(73) Assignee: Freiberger Compound Materials GmbH, Freiberg (DE)

( * ) Notice: Subject to any disclaimer, the term of this patent is extended or adjusted under 35 U.S.C. 154(b) by 614 days.

(21) Appl. No.: 12/500,037

(22) Filed: Jul. 9, 2009

(65) Prior Publication Data

US 2010/0006777 A1  Jan. 14, 2010

Related U.S. Application Data

(60) Provisional application No. 61/079,902, filed on Jul. 11, 2008.

(51) Int. Cl.
  *B32B 5/16* (2006.01)
(52) U.S. Cl. ........... 428/402; 423/1; 117/81; 117/82; 117/83; 252/518.1; 252/519.14
(58) Field of Classification Search .......... 117/81, 117/82, 83; 428/402; 423/1; 252/518.1, 252/519.14
  See application file for complete search history.

(56) References Cited

U.S. PATENT DOCUMENTS

| | | | |
|---|---|---|---|
| 3,496,118 | A | 2/1970 | Willardson et al. |
| 3,777,009 | A | 12/1973 | Menashi et al. |
| 4,776,971 | A | 10/1988 | Mattera et al. |
| 4,911,780 | A | 3/1990 | Morioka et al. |
| 4,999,082 | A | 3/1991 | Kremer et al. |
| 5,186,784 | A | 2/1993 | Rau et al. |
| 5,223,449 | A | 6/1993 | Morris et al. |
| 5,471,938 | A | 12/1995 | Uchida et al. |
| 5,612,014 | A * | 3/1997 | Inoue et al. .......... 423/417 |
| 6,287,478 | B1 | 9/2001 | Klocek |
| 6,325,849 | B1 | 12/2001 | Hideo et al. |
| 7,214,269 | B2 | 5/2007 | Wachi et al. |
| 7,410,540 | B2 * | 8/2008 | Kretzer et al. .......... 117/81 |
| 2003/0200913 | A1 | 10/2003 | Kawase et al. |
| 2004/0187768 | A1 | 9/2004 | Itani et al. |
| 2006/0081306 | A1 | 4/2006 | Wachi et al. |

FOREIGN PATENT DOCUMENTS

| | | |
|---|---|---|
| DE | 10 2004 015 863 A1 | 4/2005 |
| JP | 10-279398 A | 10/1998 |
| JP | 11-268998 A | 10/1999 |
| JP | 2000-086398 A | 3/2000 |
| JP | 2000-109400 A | 4/2000 |
| JP | 2004-099390 A | 4/2004 |
| JP | 2004/115339 * | 4/2004 |
| JP | 2004-115339 A | 4/2004 |
| JP | 2004-137096 A | 5/2004 |
| JP | 2004-217508 A | 8/2004 |
| WO | WO 2005/007939 A1 | 1/2005 |

OTHER PUBLICATIONS

A. Croll et al., "Floating-zone growth of GaAs", Journal of Crystal Growth, No. 166, (1996), pp. 239-244.
H. Wenzl et al., "Phase relations in GaAs crystal growth", Journal of Crystal Growth, No. 109, (1991), pp. 191-204.
A. S. Jordan, "Determination of the total emittance of n-type GaAs with application to Czochralski growth", Journal of Applied Physics 51, 4 (1980), pp. 2218-2227.
W. G. Spitzer et al., "Infrared absorption and electron effective mass in n-type gallium arsenide," Physical Review 114, 1 (1959) pp. 59-63.
J. S. Blakemore, "Semiconducting and other major properties of gallium arsenide", Journal of Applied Physics 53, 10 (1982), pp. R123-R181.
G. M. Martin, "Optical assessment of the main electron trap in bulk semi-insulating GaAs," Applied Physics Letters 39, 9 (1981), pp. 747-748.
K. Elliot et al., "Identification of $As_{Ga}$ antisite defects in liquid encapsulated Czochralski GaAs," Applied Physics Letters 44, 9 (1984), pp. 907-909.
M. Bäumler, et al., "Photoresponse of the $As_{Ga}$ antisite defect in as-grown GaAs," Applied Physics Letters 45, 8 (1985), pp. 781-783.
P. Silverberg, et al., "Hole photoionization cross sections of EL2 in GaAs," Applied Physics Letters 52, 20 (1988), pp. 1689-1691.
G. M. Martin, et al., "Compensation mechanisms in GaAs," Journal of Applied Physics 51, 5 (1980), pp. 2840-2852.
D. E. Holmes, et al., "Stoichiometry-controlled compensation in liquid encapsulated Czochralski GaAs," Applied Physics Letters 40, 1 (1982), pp. 46-48.
J. Lagowski, et al., "Origin of the 0.82-eV electron trap in GaAs and its annihilation by shallow donors," Applied Physics Letters 40, 4 (1982) 342-344.
D. T. J. Hurle, "A comprehensive thermodynamic analysis of native point defect and dopant solubilities in gallium arsenide", Journal of Applied Physics 85, 10 (1999), pp. 6957-7022.
M. Wickert, "Physikalische Mechanismen der Homogenisierung elektrischer Eigenschaften von GaAs-Substraten," Dissertation, Fakultät für Mathematik und Physik der Albert-Ludwigs-Universität Freiburg i. Br., 1998 (with English Excerpt Translation, 5 pgs.).
J. Stenzenberger, et al., "Growth and characterization of 200 mm SI GaAs crystals grown by the VGF Method," Journal of Crystal Growth 250 (2003), pp. 57-61.

(Continued)

*Primary Examiner* — Leszek Kiliman
(74) *Attorney, Agent, or Firm* — Foley & Lardner LLP

(57) ABSTRACT

A process is disclosed for producing a doped gallium arsenide single crystal by melting a gallium arsenide starting material and subsequently solidifying the gallium arsenide melt, wherein the gallium arsenide melt contains an excess of gallium relative to the stoichiometric composition, and wherein it is provided for a boron concentration of at least $5 \times 10^{17}$ $cm^{-3}$ in the melt or in the obtained crystal. The thus obtained crystal is characterized by a unique combination of low dislocation density, high conductivity and yet excellent, very low optic absorption, particularly in the range of the near infrared.

6 Claims, 2 Drawing Sheets

OTHER PUBLICATIONS

J. Nishio et al., "Theoretical analysis for the segregation in the liquid encapsulated Czochralski system", The Journal of Crystal Growth, 141(1-2), 1994, pp. 249-255.

U.S. Appl. No. 12/034,345, filed Feb. 20, 2008, Kretzer et al.

Korean Patent Abstract, KR 101992010134 B1, Goldstar Cable Co., Nov. 16, 1992.

R. Fornari et al., "Dislocation-Free Silicon-Doped Gallium Arsenide Grown by LEC Procedure," Journal of Crystal Growth, vol. 63, 1983, pp. 415-418.

I.C. Bassignana et al., "Variation in the lattice parameter and crystal quality of commercially available Si-doped GaAs substrates," Journal of Crystal Growth, vol. 178, 1997, pp. 445-458.

J.B. Mullin et al., "A Study on the Relationship Between Growth Technique and Dopants on the Electrical Properties of GaAs with Special Reference to LEC Growth," Journal of Crystal Growth, vol. 50, 1980, pp. 625-637.

T. Bünger et al., "Development of a vertical gradient freeze process for low EPD GaAs substrates," Materials Science Engineering, vol. B80, 2001, pp. 5-9.

ASTM International Designation: F 76-86, "Standard Test Methods for Measuring Resistivity and Hall Coefficient and Determining Hall Mobility in Single-Crystal Semiconductors," 2002, pp. 1-13.

U. Kretzer, U.S. PTO Office Action, U.S. Appl. No. 12/034,345, dated Sep. 24, 2008, 10 pages.

U. Kretzer, U.S. PTO Office Action, U.S. Appl. No. 12/034,345, dated May 13, 2009, 9 pages.

U. Kretzer, U.S. PTO Office Action, U.S. Appl. No. 12/034,345, dated Oct. 7, 2009, 11 pages.

U. Kretzer, U.S. PTO Office Action, U.S. Appl. No. 12/034,345, dated May 12, 2010, 11 pages.

U. Kretzer, U.S. PTO Office Action, U.S. Appl. No. 12/034,345, dated Nov. 10, 2010, 14 pages.

Newman, R.C., The lattice locations of silicon impurities in GaAs: effects due to stoichiometry, the Fermi energy, the solubility limit and DX behaviour, Semicond. Sci. Technol., 9, 1994, pp. 1749-1762.

Korb et al., Carbon, oxygen, boron, hydrogen and nitrogen in the LEC growth of SI GaAs: a thermochemical approach, Journal of Crystal Growth 198/199, 1999, pp. 343-348.

Kitamoto et al., Optical measurement of carrier concentration profile in n-type semiconducting GaAs substrate, Phys. Stat. Sol. (a), 204(4), 2007, pp. 1002-1007.

Osamura and Murakami, Free Carrier Absorption in n-GaAs, Japanese Journal of Applied Physics, 11(3), 1972, pp. 365-371.

Kozlova et al., A comparative study of EL2 and other deep centers in undoped SI GaAs using optical absorption spectra and photoconductivity measurements, Nuclear Instruments and Methods in Physics Research A, 512, 2003, pp. 1-7.

Hagi et al., Low Dislocation Density 3-inch Si doped GaAs Crystals by Vertical Boat Growth, Semiconducting and Semi-Insulating Materials Conference, IEEE, 1996, pp. 279-282.

\* cited by examiner

PROCESS FOR PRODUCING DOPED GALLIUM ARSENIDE SUBSTRATE WAFERS HAVING LOW OPTICAL ABSORPTION COEFFICIENT

This application claims the benefit of U.S. Provisional Application 61/079,902, filed Jul. 11, 2008, entitled "Verfahren Zur Herstellung Von Dotierten Galliumarsenid-substratwafern Mit Niedrigem Optischen Absorptionskoeffizienten," which is hereby incorporated in its entirety by reference.

The present invention relates to a process for producing gallium arsenide single crystals by solidification of a melt of the semiconductor material using a seed crystal of the same semiconductor material as the semiconductor single crystal to be produced.

For the use of gallium arsenide substrate wafers for producing light-emitting devices such as semiconductor lasers and luminescence diodes, usually a high electric conductivity of the substrate wafer is required. In special devices, the light radiation is generated in the substrate wafer itself, or it passes through it parallel or perpendicular to the wafer surface. In said devices, high electric and optical power densities usually occur. At high power densities dislocations passing through the active layers of the devices may lead to a degradation and to a failure of the device.

In [14], a process for producing silicon-doped gallium arsenide single crystals by means of the Vertical Bridgman method (VB) or the Vertical Gradient Freeze method (VGF) is described. The claimed characteristics of the substrate wafers made from the crystals include a carrier concentration of $(0.1\text{-}5.0) \times 10^{18} \text{ cm}^{-3}$ and a dislocation density of $5000 \text{ cm}^{-2}$ or lower. For devices having high electric and optical power densities, a substantially lower dislocation density is required.

The dislocation density of semiconductor crystals can be lowered by adding a dopant effecting a hardening of the crystal lattice. In [15], a method is described, by which the dislocation density of p-conducting zinc-doped gallium arsenide crystals is allowed to be lowered to values below $500 \text{ cm}^{-2}$ by the additional doping with silicon. A method for further reducing the dislocation density is described in [16]. By the additional doping of the crystals with elements, which are incorporated into the crystal lattice of gallium arsenide iso-electronically, e.g. indium, the dislocation density in p-conducting gallium arsenide crystals are allowed to be lowered to values of below $100 \text{ cm}^{-2}$.

At room temperature gallium arsenide single crystals are transparent for electromagnetic radiation in the near infrared having photon energies that are lower than the energy of the band gap. For this, the wavelength of the electromagnetic radiation must be higher than 870 nm. The transmission degree for wavelengths between 900 nm and 4 µm is determined by two interacting processes of the photons of the entering electromagnetic radiation with electrons of the gallium arsenide single crystal. In the first process, electrons, by absorption of photons, are excited from a low energy level of the conduction band into a higher energy level (see [1]). The absorption coefficient $\alpha_{ib}$, which is ascribed to this process, is proportional to the concentration of electrons in the conduction band for a given wavelength. In crystals with an electric conductivity of n-type, this corresponds to the charge carrier concentration n. The proportional factor is dependent on the wavelength $\lambda$ and may, for example for $\lambda=2$ µm, adopt a value of $6 \times 10^{-18} \text{ cm}^{-2}$ [2], [3]. A known demand for a high charge carrier concentration thus counteracts the aim to achieve low absorption coefficients.

The second process consists in the light-induced excitation of electrons from the energy level EL2 into the conduction band [4]. The EL2-level is generated by arsenic anti-structural defects $As_{Ga}$, [5], [6], hence this defect is also denoted EL2-defect. The corresponding absorption coefficient $\alpha_{EL2}$ is proportional to the concentration of $As_{Ga}$ in the crystal. The proportional factor is dependent on the wavelength $\lambda$ and corresponds, in crystals having high conductivity of n-type, to the cross section of optic absorption $\sigma_n^\circ$ of the EL2-defect in the neutral conductivity status. Experimental values for the cross section of absorption $\sigma_n^\circ$ are published in [7].

The concentration of EL2-defects in a gallium arsenide single crystal is predominantly determined by the composition of the gallium arsenide melt, from which the single crystal is produced by solidification. Crystals which solidify from stoichiometric or arsenic-rich melts contain EL2-defects in a concentration range of $(1\text{-}2) \times 10^{16} \text{ cm}^{-3}$. In crystals that contain only a low concentration of foreign substances and a small excess of acceptor defects, the presence of EL2-defects in this concentration range gives rise to a very low electric conductivity [8]. Therefore for producing such crystals, melts are usually used in which the arsenic mole-ratio $x_{As}/(x_{As}+x_{Ga})$ is at least 0.5. In [9], the aim is pursued to achieve an EL2-concentration as homogenous as possible in the range of $0.8\text{-}1.4 \times 10^{16} \text{ cm}^{-3}$ in the whole axial distribution of the crystal. When comparing crystals which have been produced from melts with respectively different arsenic molar ratios, it was found that the desired EL2-homogeneity is achieved when the arsenic molar ratio of the melt is stably 0.5. Experimental data in [10] show a dependency of the EL2-concentration from the arsenic molar ratio for crystals which have been produced according to the LEC process.

The concentration of the EL2-defects can be strongly reduced when the crystals are doped with dopants that produce a high conductivity of n-type (cf. [11]). Thermodynamic calculations show that the value of the arsenic molar ratio influences the concentration of the EL2-defects (cf. [12]).

The dependency of the EL2-concentration from the arsenic molar ratio of the melt from which an gallium arsenide crystal is solidified, as shown in the literature [9] and [10], was contemplated therein with a view of its effect on the specific electric resistivity and the electric conductivity in these crystals. In [9], the EL2-concentration of the crystals is correlated with characteristics of the MESFET produced from the substrate wafers. According to the measures described therein, the magnitude of the EL2-concentration influences the high frequency performance of these devices. There is no reference to possibly changing the optical absorption coefficient, because there is no correlation between the optical absorption coefficient of the substrate wafer and the characteristics of a MESFET produced from this substrate wafer.

It is an object of the invention to provide a process for producing gallium arsenide single crystals having low optical absorption coefficients, as well as gallium arsenide single crystals as such. It would be further desirable to take account concurrently of the problems of a sufficient electric conductivity, preferably one of n-type, on the one hand and a provision of low dislocation densities on the other hand.

According to an aspect the problem is solved by a process, according to which a doped gallium arsenide single crystal is produced by melting a gallium arsenide starting material and subsequently solidifying the gallium arsenide melt, wherein attention is paid to that the gallium arsenide melt contains an excess of gallium relative to the stoichiometric composition, and that a boron concentration of at least $5 \times 10^{17} \text{ cm}^{-3}$ in the gallium arsenide melt is provided for. Preferred embodiments of the process according to the invention are set forth in the subclaims to claim 1.

According to an aspect, the object is solved by a GaAs single crystal i.e. a gallium arsenide single crystal having a charge carrier concentration of at least $1\times10^{16}$ cm$^{-3}$ and at most $1\times10^{18}$ cm$^{-3}$, and an optical absorption coefficient of at most 2.5 cm$^{-1}$ at a wavelength of 1000 nm, of at most 1.8 cm$^{-1}$ at a wavelength of 1100 nm and at most 1.0 cm$^{-1}$ at a wavelength of 1200 nm, or a gallium arsenide single crystal having an electron concentration of at least $1\times10^{15}$ cm$^{-3}$ and at most $1\times10^{18}$ cm$^{-3}$, and an optic absorption coefficient of at most 2.0 cm$^{-1}$ at a wavelength of 1000 nm, of at most 1.4 cm$^{-1}$ at a wavelength of 1100 nm and at most 0.8 cm$^{-1}$ at a wavelength of 1200 nm.

According to still another aspect, a gallium arsenide substrate wafer is provided according to the invention, which is formed from a gallium arsenide single crystal as defined above. The features described above and below in more detail with respect to the single crystal correspondingly apply to the individualized wafers obtained therefrom.

According to the invention, critical factors and conditions were found as to how, despite the counter-acting effects of mechanisms of action recognized as relevant, a high electric conductivity—in particular one of n-type—can be concurrently combined with a low optical absorption coefficient in the near infrared, in particular for electromagnetic radiation having a wavelength in the range of 900 nm to 1700 nm, and a mean etch pitch density of at most 500 cm$^{-2}$. In process terms, this is technically realized by taking critical care of both an excess of gallium in the gallium arsenide melt, and a required minimum concentration of boron. In product terms, a specific charge carrier concentration is adjustable according to the invention, in which significantly improved parameters of the optical absorption coefficient is effected and, at the same time, due account is taken to the requirement of a sufficient charge carrier concentration. Moreover, a beneficial low area density of dislocation etch pitches can be controlled in cross-sections perpendicular to the crystal axis.

The gallium arsenide single crystal obtainable according to the invention is particularly characterized by a unique combination of low dislocation density, high conductivity and yet excellent, very low optical absorption especially in the IR range, and there, above all, in the near infrared.

With the features and characteristics achievable according to the invention, the obtained crystals and the substrate wafers produced therefrom are outstandingly suitable for use in the manufacture of electro-optical devices, in which the generated radiation passes the substrate wafer parallel or perpendicular to the wafer surface. Since the optic absorption coefficient of the semiconductor material, from which the substrate wafer is formed, can be maintained at a low level in the above defined spectral range of the generated radiation in despite of the relatively high charge carrier concentration, the devices produced from the wafer according to the invention show a high efficiency. The risk of degradation and failure of the device, which may be caused due to high electric and optical power densities in the active layers of the devices, is reduced or even completely inhibited by the very low area density of etch pitches as a measure of the dislocation density, achievable at the same time. The low dislocation densities achievable according to the invention, which can be controlled depending on the applications to lower than 1500 cm$^{-2}$ or even below 500 cm$^{-2}$, provides for a beneficial long lifetime of the devices produced by the substrate wafers according to the invention.

The invention, its advantages and preferred embodiments as well as examples will be described in more detail below by reference to the Figures, wherein embodiments, examples and Figures however serve only for illustration and by no means limit the invention.

FIG. 1 shows, in examples, topograms of the local etch pitch dislocation density, which serves as a measure for the dislocation density, of wafers made of two gallium arsenide single crystals doped with silicon, wherein both wafers have a comparable charge carrier concentration but differ in that either no additional boron and no additional over-stoichiometric of gallium were added (comparison on the left side), or boron and gallium in excess of stoichiometry were purposefully added respectively in appropriate amounts (according to an embodiment of the process of the invention on the right side).

Figure 1:
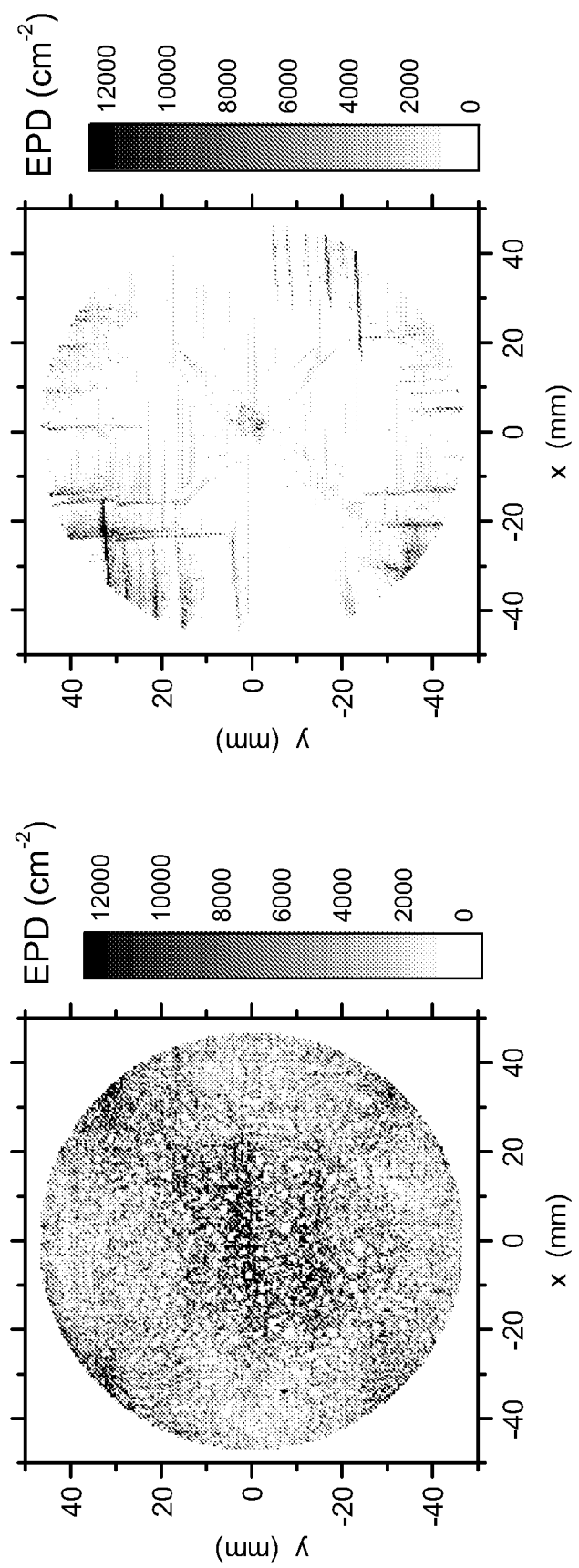

A significant contribution, relevant in the process, for achieving the effects of the invention is accomplished by paying attention to a molar excess of gallium with respect to arsenic in the gallium arsenide melt, wherein this contribution takes effect and leads to a synergistic effect not before the charge carrier concentration lies in a range of $\leq 1\times10^{18}$ cm$^{-3}$, and, above all, in a range of $\leq 5\times10^{17}$ cm$^{-3}$. A favourable influence on the reduction of the optical absorption coefficient is accomplished particularly when the molar excess of gallium in the gallium arsenide melt, before the start of solidification, is 0.01 to 2 mole-%. Said stoichiometric excess of gallium relative to arsenic shall prevail at the latest when solidification of the gallium arsenide melt starts. Suitably, this is accomplished by addition of an appropriate over-stoichiometric amount of gallium to the starting materials into the crucible, before starting melting the starting materials.

The process according to an invention is preferably carried out, and correspondingly a gallium arsenide single crystal is obtained, that the doping of the gallium arsenide single crystal has a conductivity of n-type. In this case, the desired combination of a relatively high concentration of charge carriers, which in this case are made available by the electron concentration, and low absorption coefficient can be achieved in a particularly effective manner. The dopant, which is most suitable for this, is silicon (Si), in elementary or chemically bound form. Compared to only semi-insulating gallium arsenide, a remarkably better conductivity is achieved, which is important in the use, and in comparison with a p-type conductivity, the optical absorption coefficient—at a comparable charge carrier concentration—is much smaller when the gallium arsenide of the invention is of n-type.

Possible dopants alternative to Si or in addition to Si are elements of the groups II, IV and VI of the Periodic Table of Elements, which respectively take effect on the conductivity of the gallium arsenide single crystal, such as beryllium (Be), magnesium (Mg), germanium (Ge), carbon (C), tellurium (Te), sulfur (S) and selenium (Se), but also transition elements such as zinc (Zn), tin (Sn), cadmium (Cd) and the like, respectively alone or in mixture, and respectively in elementary or chemically bound form. Independent from the dopants used it is however important to pay attention that the obtained charge carrier concentration does not exceed $1\times10^{18}$ cm$^{-3}$ and particularly $5\times10^{17}$ cm$^{-3}$, and that at the same time the stoichiometric excess of gallium relative to arsenic is observed as defined, in order to be able to reach the desired parameters of the optical absorption coefficient. In view of the achievement of low optical absorption coefficients, silicon is particularly preferred as dopant. The supplemental addition of multiple further dopants, for example in addition to Si and further to the addition of boron described below, is to be avoided, e.g. the further addition of both Zn and In. Furthermore, the ratio of Si to another, p-conductivity generating dopant is preferably >1, more preferably >10.

The additional amount of dopant is guided by the observation that the charge carrier concentration in the obtained solidified gallium arsenide single crystal suitably is at least $1\times10^{15}$ cm$^{-3}$, preferably at least $1\times10^{16}$ cm$^{-3}$, and particularly at least $1\times10^{17}$ cm$^{-3}$.

An important feature of the process according to the invention resides in that a sufficient boron concentration in the gallium arsenide melt is provided for. For adjusting the observable amount of boron, boron is suitably added to the gallium arsenide starting material and/or to the gallium arsenide melt. Optionally and further preferably, boron may be incorporated additionally by providing a boron oxide cover melt above the gallium arsenide melt, in order to provide for the desired total boron concentration. It is possible to compromise thereby a decrease of the dopant concentration being important for decreasing the optical absorption coefficient in such a manner that an appropriate charge carrier concentration range is obtained which satisfies the performance characteristics of the device made from the wafer. An additionally beneficial effect resides in that a low dislocation density is achievable in combination. Correspondingly, the gallium arsenide single crystal obtained preferably has a boron concentration of at least $5\times10^{17}$ cm$^{-3}$, more preferably at least $1\times10^{18}$ cm$^{-3}$, and particularly at least $2\times10^{18}$ cm$^{-3}$. Further advantages associated with the incorporation of boron into the gallium arsenide single crystal according to the invention—and hence in the wafers individualized therefrom—reside in that the energy barrier leading to the formation of dislocations is substantially raised, which translates into a control of the area density of etch pitches at the cross-sections perpendicular to the crystal axis of at most 1500 cm$^{-2}$, preferably at most 500 cm$^{-2}$.

According to a preferred embodiment of the process of the invention, melting and solidifying preferably is carried out in a crucible using a seed crystal made of gallium arsenide. This manner of operation allows an efficient crystal formation, in particular at the critical initial phase of crystal formation, and it allows an adjustment of the amount of boron to be observed in the course of the melting and the solidification process and thus contributes to achieving the desired result. The process principle usable for the invention is in particular preferably based on a directed solidification, for example according to the Vertical Gradient Freeze method (VGF) or the Vertical Bridgman method (VB).

The total absorption coefficient $\alpha_t$ in the wavelength range of 900 nm to 4 μm is a result of the sum of the absorption cross-sections $\alpha_{tb}$ and $\alpha_{EL2}$.

A low absorption coefficient $\alpha_t$ can be achieved by reducing the charge carrier concentration, by a decrease of the concentration of the EL2-defects, or by both measures. However, limits are posed for the reduction of the charge carrier concentration. For the performance of light-emitting devices, usually a high electric conductivity of the substrate wafer, in particular those of n-type, is required, which is achieved by an appropriate doping. As a rule, the charge carrier concentration is at least $1\times10^{15}$ cm$^{-3}$, preferably at least $1\times10^{16}$ cm$^{-3}$, and particularly at least $1\times10^{17}$ cm$^{-3}$. A further lowering of the optical absorption coefficient thus can only be achieved by contemplating a lowering of the concentration of the E2-defects in combination. Preferably, the system is influenced in such a manner that the EL2-concentration preferably is below $1\times10^{16}$ cm$^{-3}$, more preferably below $5\times10^{15}$ cm$^{-3}$ and particularly below $1\times10^{15}$ cm$^{-3}$.

Usual processes for the production of single crystals made of gallium arsenide use a covering melt of boron oxide ($B_2O_3$) for avoiding evaporation of arsenic from the gallium arsenide melt. For producing gallium arsenide crystals having a high electric conductivity, particularly those of n-type, a suitable dopant such as e.g. silicon is used. Adding dopant such as silicon into the gallium arsenide melt in concentrations that are needed for adjusting a desirable charge carrier concentration in the resulting crystals of e.g. at least $1\times10^{16}$ cm$^{-3}$ causes a reaction of the dopant such as silicon with the covering melt of boron oxide. A part of the dopant is oxidized, whereupon the generated boron dissolves in the gallium arsenide melt. This incorporation of boron into the melt leads to an impurity of boron in the produced crystals. Then, the concentration of boron in the crystals is usually comparable to the concentration of the dopant silicon, as e.g. was shown in [17] for a case of silicon as dopant. This accidental concentration of boron, incorporated as impurity, leads to a hardening of the crystal lattice in gallium arsenide crystals, particularly in case of n-conducting silicon-doped crystals.

If the desired charge carrier concentration of the gallium arsenide crystals is lower than $1\times10^{18}$ cm$^{-3}$ and, above all, lower than $5\times10^{17}$ cm$^{-3}$, as was found to be critical for achieving a low optical absorption coefficient, then the amount of a suitable dopant such as silicon, which is to be added to the gallium arsenide melt, is too low in order to typically achieve the desired magnitude of effects ascribable to boron, including an effective hardening of the lattice and thus a reduction of the dislocation density. This applies particularly in cases, where the area density of etch pitches on cross-sectional areas perpendicular to the crystal axis shall be lower than 1500 cm$^{-2}$, and above all in cases where these shall be still lower, e.g. <500 cm$^{-2}$. This can be compensated by adding further boron when producing doped gallium arsenide crystals, particularly with silicon-doped gallium arsenide crystals intended for resulting in charge carrier concentrations of lower than $1\times10^{18}$ cm$^{-3}$ and above all lower than $5\times10^{17}$ cm$^{-3}$ in the product, so that the boron concentration in the gallium arsenide melt and thus in the solidified crystal is at least $5\times10^{17}$ cm$^{-3}$.

DESCRIPTION OF NON-LIMITING EXAMPLES ACCORDING TO PREFERRED EMBODIMENTS

For producing a gallium arsenide crystal doped with silicon according to a conventional process, an amount of 9 kg stoichiometric, polycrystalline gallium arsenide and 1.3 g elementary silicon were charged into a cylindrically shaped crucible made of pyrolytically deposited boron nitride (pBN) closed on one side. This crucible comprised a tapered portion at the closed end, extending into a further cylindrical portion with a smaller diameter, in which a gallium arsenide seed crystal was placed. The crucible charge was covered by a cylindrical plate of boron oxide. In a Vertical Gradient Freeze (VGF) crystal growth apparatus as described in [18], the crucible and its content were heated by heaters provided outside of the crucible such that the polycrystalline gallium arsenide and the boron oxide were melted and the silicon was dissolved in the gallium arsenide melt. Subsequently, the temperature gradient within the crucible was changed by a suitable control of the heaters such that, starting from the seed crystal, a directed solidification of the gallium arsenide melt proceeded. The solidified crystal was cooled to room temperature, and its cylindrical portion was processed to wafers. A wafer close to the seed portion of the crystal cylinder (ingot) had a charge carrier concentration of $1.0\times10^{17}$ cm$^{-3}$, an etch pitch density of 3820 cm$^{-2}$ (see left drawing in FIG. 1), a boron content of $1.5\times10^{17}$ cm$^{-3}$, and an optical absorption coefficient at a wavelength at 1046 nm of 2.2 cm$^{-3}$.

For producing a crystal according to the process of the invention, other than the above described conventional process, an additional amount of 370 g of elementary gallium was further charged into the crucible, in order to obtain a gallium-rich gallium arsenide melt with an arsenic molar ratio of 0.48. The melt was doped, like in the conventional process, by the addition of 1.3 g elementary silicon, however in another difference thereto, by a further addition of 0.46 g elementary boron. The solidification of the melt was carried out in the same manner as the described for the conventional process. A wafer close to the seed portion of the crystal cylinder (ingot) had a charge carrier concentration of $1.3\times10^{7}$ cm$^{-3}$, an etch pitch density of 470 cm$^{-2}$ (see right drawing in FIG. 1), a boron content of $2.1\times10^{18}$ cm$^{-3}$, and an optical absorption coefficient at a wavelength at 1046 nm of 1.8 cm$^{-1}$.

In FIG. 1, topograms of local densities of etch pitches, which serve as a measure for the dislocation density, are shown for wafers made of the two crystals doped with silicon as obtained as described before. Both wafers have a comparable charge carrier concentration of $1.0\times10^{17}$ cm$^{-3}$ or $1.3\times10^{17}$ cm$^{-3}$ and respectively derive from the portion of the cylindrical part of the crystals close to the seed. The local EPD was measured over the whole area in measurement fields with sizes of 0.5 mm×0.5 mm.

Results:

Left side: mean value of EPD=3820 cm$^{-2}$, charge carrier concentration n=$1.0\times10^{17}$ cm$^{-3}$, boron content=$1.5\times10^{17}$ cm$^{-3}$ Right side: mean value of EPD=470 cm$^{-2}$, charge carrier concentration n=$1.3\times10^{17}$ cm$^{-3}$, boron content=$2.1\times10^{18}$ cm$^{-3}$.

The etch pitch density of the wafer made from the crystal, which was not selectively doped with boron, was 3820 cm$^{-2}$. On the other hand, the etch pitch density of the wafer made from the crystal, which was selectively doped with a final boron concentration of $2.1\times10^{18}$ cm$^{-3}$, was only 470 cm$^{-2}$. Thus, this wafer satisfies the aim of a low charge carrier concentration of lower than $5\times10^{17}$ cm$^{-3}$ at a concurrently low dislocation density of lower than 500 cm$^{-2}$.

Figure 2:
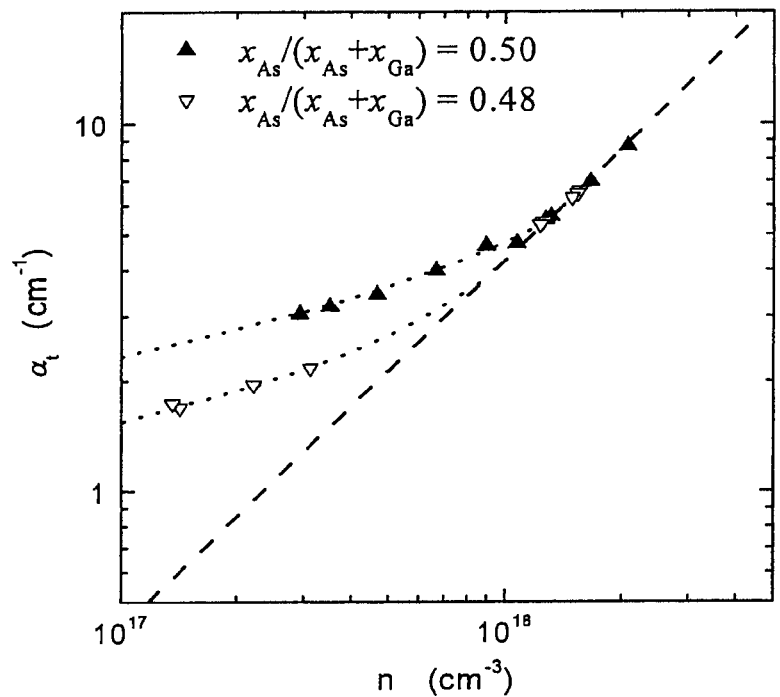
FIG. 2 shows the dependency of the optical transmission coefficient $\alpha_t$ from the charge carrier concentration n for two gallium arsenide single crystals doped with silicon, which respectively were solidified from melts having an arsenic molar ratio $x_{As}/(x_{As}+x_{Ga})$ of 0.50 and 0.48, respectively.

In FIG. 2, the dependency of the optical transmission coefficient $\alpha_t$ from the charge carrier concentration n is shown for two silicon-doped gallium arsenide crystals, which were solidified from melts having an arsenic molar ratio $x_{As}/(x_{As}+x_{Ga})$ of 0.50 or 0.48. The measurement values were obtained from samples, which were prepared from wafers double-sided polished chemically-mechanically. For this, a square portion having a lateral size of 20×20 mm$^2$ was respectively removed by cutting from an almost dislocation-free area of the wafer. The measurement of the charge carrier concentration n was carried out by means of the van-der-Pauw and the Hallmethods. The optical absorption coefficient (optical transmission coefficient) $\alpha_t$ was determined at a wavelength of 11046 nm in dependency from the charge carrier concentration n by means of an optical transmission topography according to [13].

The dashed line would correspond to a direct proportionality between n and a, which applies for samples in which the concentration of EL2-defects is negligibly small. Starting from the seed side, the charge carrier concentration in both crystals increased in the axial direction, so that samples with different charge carrier concentrations could be obtained from both crystals.

Therefore, the dashed line in FIG. 2 corresponds to a direct proportionality between $\alpha_t$ and n. The proportionality factor at a wavelength of 1046 nm is $4.36\times10^{-16}$ cm$^2$. The proportionality of both values occurs, when the absorption by EL2-defects is negligibly small, i.e. when the concentration of the EL2-defects is substantially below $1\times10^{15}$ cm$^{-3}$. In this case, the absorption coefficient $\alpha_{EL2}$ caused by EL2is lower than 0.125 cm$^{-1}$. The observed total absorption results from the scattering of photons at electrons in the conductivity bands. For low values of n, the measurement points for both crystals deviate remarkably from the proportionality. This means that in the samples concerned, a part of the absorption is caused by EL2-defects. In case of the crystal, which was solidified from a melt having an arsenic molar ratio of 0.50, the deviation from proportionality between $\alpha_t$ and n is stronger than in the other crystal, because the EL2-concentration in the former is higher than in the latter (see also FIG. 3).

Figure 3:
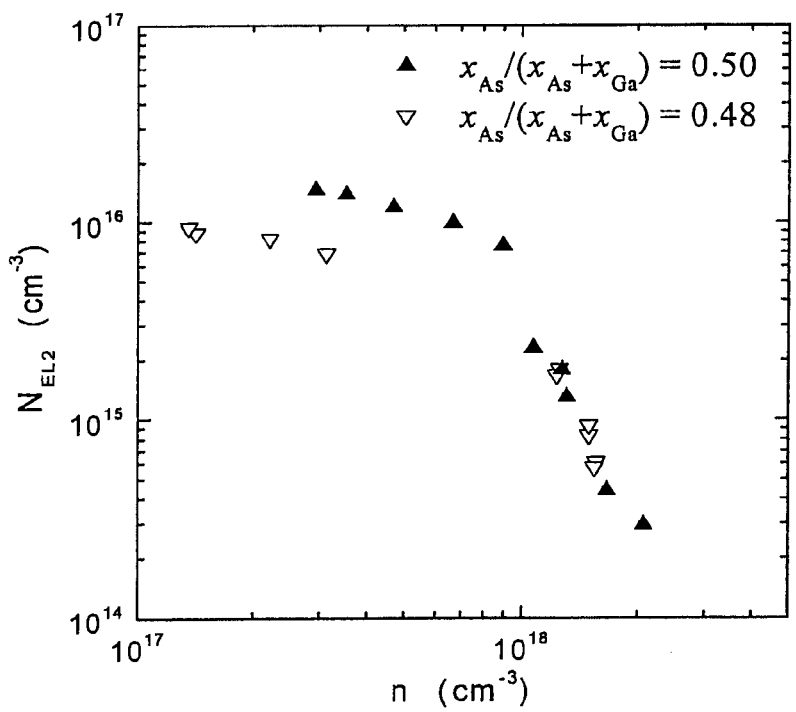
FIG. 3 shows the dependency of the concentration of EL2-defects from the charge carrier concentration for the two crystals illustrated in FIG. 2.

In FIG. 3, the dependency of the concentration of EL2-defects $N_{EL2}$ from the charge carrier concentration n for both of these crystals, which were solidified from melts having an arsenic molar ratio $x_{As}/(x_{As}+x_{Ga})$ of 0.50 or 0.48, respectively, is illustrated. The EL2-concentration was obtained as follows: for each sample, the absorption coefficient $\alpha_{ib}$ was calculated from the charge carrier concentration n using a proportion factor of $4.36\times10^{-16}$ cm$^2$ of. This value was subtracted from the measured absorption coefficient $\alpha_t$. The difference corresponds to the absorption caused by EL2-defects and was converted into an concentration value of the EL2-defects using an absorption cross-section of $1.25\times10^{-16}$ cm$^2$ according to [7].

FIGS. 2 and 3 show by way of examples for a wavelength of 1046 nm that the optical absorption coefficient of the semiconductor material can be lowered by reducing the arsenic content of the melt, from which a gallium arsenide crystal solidifies. This reduction is due to a decrease of the concentration of EL2-defects. Thus, the process according to the invention realizes the production of crystals, which have both the desired high conductivity, in particular of n-type characterized by a charge carrier concentration of at least $1\times10^{15}$ cm$^{-3}$ and even of at least $1\times10^{16}$ cm$^{-3}$, and a low optical absorption coefficient in the near infrared.

The following patent and non-patent literature is referred to in the present specification:

[1] A. S. Jordan, *Determination of the total emittance of n-type GaAs with application to Czochralski growth*, Journal of Applied Physics 51, 4 (1980) 2218-2227

[2] W. G. Spitzer, J. M. Whelan *Infrared absorption and electron effective mass in n-type gallium arsenide*, Physical Review 114, 1 (1959) 59-63

[3] J. S. Blakemore Semiconducting and other major properties of gallium arsenide, Journal of Applied Physics 53, 10 (1982) R123-R180

[4] G. M. Martin *Optical assessment of the main electron trap in bulk semi-insulating GaAs*, Applied Physics Letters 39, 9 (1981) 747-748

[5] K. Elliot, R. T. Chen, S. G. Greenbaum, R. J. Wagner *Identification of AsGa antisite defects in liquid encapsulated Czochralski GaAs*, Applied Physics Letters 44, 9 (1984) 907-909

[6] M. Bäumler, U. Kaufmann, J. Windscheif *Photoresponse of the AsGa antisite defect in as-grown GaAs*, Applied Physics Letters 45, 8 (1985) 781-783

[7] P. Silverberg, P. Omling, L. Samuelson *Hole photoionization cross sections of EL2 in GaAs*, Applied Physics Letters 52, 20 (1988) 1689-1691

[8] G. M. Martin, J. P. Farges, G. Jacob, J. P. Hallais *Compensation mechanisms in GaAs*, Journal of Applied Physics 51, 5 (1980) 2840-2852

[9] JP 11-268998 A *Gallium arsenic singe crystal ingot, ist production, and gallium arsenic single crystal wafer using the same*

[10] D. E. Holmes, R. T. Chen, K. R. Elliot, C. G. Kirkpatrick *Stoichiometry-controlled compensation in liquid encapsulated Czochralski GaAs*, Applied Physics Letters 40, 1 (1982) 46-48

[11] J. Lagowski, H. C. Gatos, J. M. Parsey, K. Wada, M. Kaminska, W. Walukiewicz *Origin of the 0.82-eV electron trap in GaAs and its annihilation by shallow donors*, Applied Physics Letters 40, 4 (1982) 342-344

[12] D. T. J. Hurle *A comprehensive thermodynamic analysis of native point defect and dopant solubilities in gallium arsenide*, Journal of Applied Physics 85, 10 (1999) 6957-7022

[13] M. Wickert *Physikalische Mechanismen der Homogenisierung elektrischer Eigenschaften von GaAs-Substraten*, Dissertation, Fakultät für Mathematik und Physik der Albert-Ludwigs-Universität Freiburg i. Br., 1998

[14] U.S. Pat. No. 7,214,269 Si-doped GaAs Single Crystal Substrate

[15] JP 2000-086398 P-Type GaAs Single Crystal and its Production

[16] US 2004-0187768 P-Type GaAs Single Crystal and its Production Method

[17] U.S. Pat. No. 5,612,014 Compound Semiconductor Crystal

[18] J. Stenzenberger, T. Bünger, F. Börner, S. Eichler, T. Flade, R. Hammer, M. Jurisch, U. Kretzer, S. Teichert, B. Weinert, *Growth and characterization of 200 mm SI GaAs crystals grown by the VGF Method*, Journal of Crystal Growth 250 (2003) 57-61.

The invention claimed is:

1. A process for producing a doped gallium arsenide single crystal, comprising:
   melting a gallium arsenide starting material to obtain a gallium arsenide melt, wherein boron is provided in the starting material, or boron is added to the gallium arsenide melt,
   providing for an excess of gallium relative to the stoichiometric composition in the gallium arsenide melt, wherein the excess of gallium in the gallium arsenide melt, before starting solidification, is at least 0.01 mole-%, and
   subsequently solidifying the gallium arsenide melt,
   wherein a boron concentration of at least $5 \times 10^{17}$ cm$^{-3}$ is provided for in the melt or in the obtained crystal.

2. The process according to claim 1, wherein a doped gallium arsenide single crystal having an n-type conductivity is produced.

3. The process according to claim 1, wherein the melting and the solidifying are carried out in a crucible using a seed crystal made of gallium arsenide.

4. The process according to claim 1, wherein the boron concentration of at least $5 \times 10^{17}$ cm$^{-3}$ is provided, in addition to the boron provided in the starting material or the boron added to the gallium arsenide melt, by providing a boron oxide cover layer above the gallium arsenide melt in order to thereby incorporate boron.

5. The process according to claim 1, wherein the excess of gallium in the gallium arsenide melt, before starting solidification, lies in a range of 0.01 to 2 mole-%.

6. The process according to claim 1, further comprising forming gallium arsenide substrate wafers from the obtained doped gallium arsenide single crystal.

* * * * *